(12) United States Patent
Chen et al.

(10) Patent No.: US 10,710,872 B2
(45) Date of Patent: Jul. 14, 2020

(54) MEMS PACKAGE WITH ROUGHEND INTERFACE

(71) Applicant: Taiwan Semiconductor Manufacturing Co., Ltd., Hsinchu (TW)

(72) Inventors: Yu-Jui Chen, Taipei (TW); I-Shi Wang, Sanxia Township (TW); Ren-Dou Lee, Hsinchu (TW); Jen-Hao Liu, Zhunan Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/833,072

(22) Filed: Dec. 6, 2017

(65) Prior Publication Data

US 2018/0162720 A1    Jun. 14, 2018

Related U.S. Application Data

(60) Provisional application No. 62/433,645, filed on Dec. 13, 2016.

(51) Int. Cl.
*B81B 7/00* (2006.01)
*B81C 3/00* (2006.01)
(Continued)

(52) U.S. Cl.
CPC ............ *B81B 7/007* (2013.01); *B81B 7/0077* (2013.01); *B81B 7/02* (2013.01); *B81C 1/00238* (2013.01);
(Continued)

(58) Field of Classification Search
CPC ........... H01L 2924/351; H01L 2924/00; H01L 21/50; H01L 21/67144; H01L 21/6835; H01L 21/6836; H01L 21/68771; H01L 21/68778; H01L 21/78; H01L 2221/68318; H01L 2221/68327; H01L 2221/68381; H01L 2223/54426; H01L 2223/5446; H01L 2224/75251; H01L 2224/75252; H01L 2224/75316; H01L 2224/75317; H01L 2224/75318; H01L 2224/7532; H01L 2224/757; H01L 2224/75704; H01L 2224/75724; H01L 2224/75744; H01L 2224/75822; H01L 2224/75823; H01L 2224/75824; H01L 2224/9205; H01L 2224/94; H01L 2224/97; H01L 23/544;
(Continued)

(56) References Cited

U.S. PATENT DOCUMENTS 5,578,526 A * 11/1996 Akram ..................... G01R 1/04
                                                 257/E21.526
6,072,240 A *  6/2000 Kimura ................. H01L 25/072
                                                      257/692
(Continued)

*Primary Examiner* — Edward Chin
(74) *Attorney, Agent, or Firm* — Duane Morris LLP

(57) ABSTRACT

A method includes: providing a first substrate on which a plurality of first semiconductor devices is formed; providing a second substrate on which a plurality of second semiconductor devices is formed; and coupling the first and second substrates by contacting respective dummy pads of the first and second substrates, wherein at least one of the dummy pads of the first and second substrates comprises plural peaks and valleys.

20 Claims, 15 Drawing Sheets

(51) Int. Cl.
*B81B 7/02* (2006.01)
*B81C 1/00* (2006.01)

(52) U.S. Cl.
CPC .......... *B81C 1/00269* (2013.01); *B81C 3/005* (2013.01); *B81C 3/008* (2013.01); *B81C 2203/019* (2013.01); *B81C 2203/054* (2013.01); *B81C 2203/075* (2013.01); *B81C 2203/0735* (2013.01)

(58) Field of Classification Search
CPC ......... H01L 24/75; H01L 24/89; H01L 24/97; H01L 2924/10156; H01L 29/0657; B81B 7/007; B81B 7/02; B81B 7/0006; B81B 7/0077; B81C 3/005; B81C 1/00238; B81C 1/00269; B81C 3/008; B81C 2203/054; B81C 2203/019; B81C 2203/075; B81C 2203/0735; B81C 3/001
See application file for complete search history.

(56) References Cited

U.S. PATENT DOCUMENTS

| | | | | |
|---|---|---|---|---|
| 9,508,663 | B2 * | 11/2016 | Kim | H01L 24/04 |
| 9,640,531 | B1 * | 5/2017 | Or-Bach | H01L 27/0688 |
| 2008/0070376 | A1 * | 3/2008 | Vaganov | B30B 15/061 |
| | | | | 438/455 |
| 2008/0124845 | A1 * | 5/2008 | Yu | H01L 21/76898 |
| | | | | 438/143 |
| 2012/0115305 | A1 * | 5/2012 | Peng | H01L 24/27 |
| | | | | 438/455 |
| 2012/0205812 | A1 * | 8/2012 | Sutardja | H01L 24/05 |
| | | | | 257/773 |
| 2013/0288070 | A1 * | 10/2013 | Tsau | H05K 13/04 |
| | | | | 428/612 |

* cited by examiner

MEMS PACKAGE WITH ROUGHEND INTERFACE

CROSS-REFERENCE TO RELATED APPLICATION

The present application claims priority to U.S. Provisional Patent Application No. 62/433,645, filed on Dec. 13, 2016, which is incorporated by reference herein in its entirety.

BACKGROUND

Micro-electro-mechanical systems (MEMS) devices, such as accelerometers, pressure sensors and gyroscopes, have found widespread use in many modern day electronic devices. For example, MEMS accelerometers are commonly found in automobiles (e.g., in airbag deployment systems), tablet computers or in smart phones. For many applications, MEMS devices are electrically connected to application-specific integrated circuits (ASICs) to form complete MEMS systems.

BRIEF DESCRIPTION OF THE DRAWINGS

Aspects of the present disclosure are best understood from the following detailed description when read with the accompanying figures. It is noted that various features are not necessarily drawn to scale. In fact, the dimensions of the various features may be arbitrarily increased or reduced for clarity of discussion.

DETAILED DESCRIPTION OF EXEMPLARY EMBODIMENTS

Figure 1A:
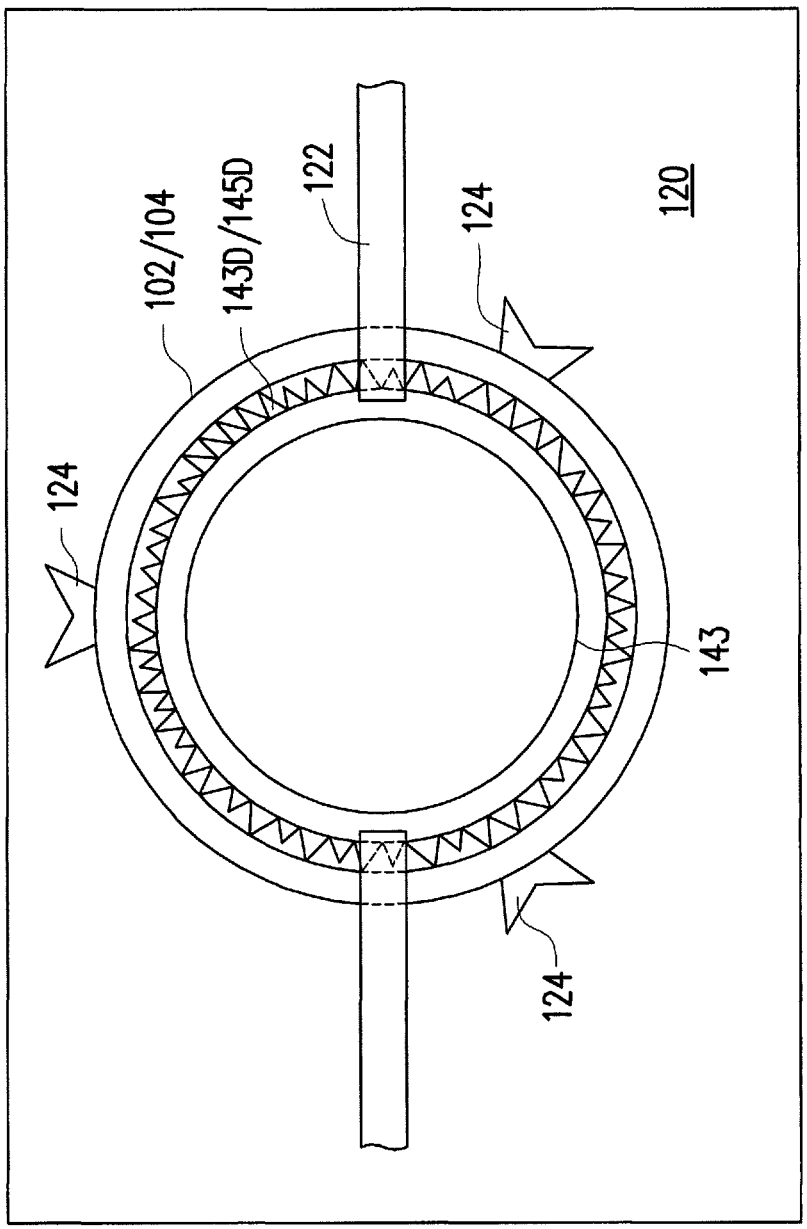
FIG. 1A illustrates a top view of a to-be forming micro-electro-mechanical system (MEMS) package, in accordance with some embodiments.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Conventionally, a hybrid integration technique uses plural off-board wires for coupling a micro-electro-mechanical system (MEMS) device to a complementary metal-oxide-semiconductor (CMOS) circuit. As used herein, "off-board" wires refer to wires that are not originally formed when either the MEMS device or the CMOS circuit is fabricated. Over the years, a monolithic integration technique that uses on-board bonding pad(s) has been actively explored to solve various issues of the conventional hybrid integration technique, for example, high assembly and packaging cost. In general, a monolithic coupling typically uses bonding pads that are formed on top surfaces of substrates/wafers on which the MEMS device and the CMOS circuit are respectively formed. After the MEMS device is bonded to the CMOS circuit (i.e., the respective wafers are coupled with each other), the respective bonding pads may be sealed. More specifically, such sealed bonding pads also serves as a guard ring surrounding active device(s) of the MEMS device and/or the CMOS circuit, so as to hermetically isolate the active device(s) from the ambient environment and protect the active device(s) from undesirable contamination (e.g., particle(s), air, electromagnetic field(s), etc.). Generally, a bonding process is performed in a chamber under an elevated temperature to anneal the respective bonding pads so as to form a "sealed" guard ring that surrounds and protects the active devices. For example, a eutectic bonding technique is typically used to perform the bonding process, which will be discussed in further detail below. However, due to a variety of process variations (e.g., different thermal expansions of the wafers on which the MEMS device and the CMOS circuit are respectively formed), either the MEMS device or the CMOS circuit may suffer one or more issues such as, for example, a lateral shift of the wafer(s). Such a lateral shift of the wafer may disadvantageously impact yield and/or performance of the active devices of the MEMS device and/or the CMOS circuit that are supposedly to be protected by the sealed guard ring.

The present disclosure provides a MEMS package including a first wafer on which a MEMS device is formed and a second wafer on which a CMOS circuit is formed, wherein each of the first and second wafers includes at least a respective bonding pad and a respective dummy pad that has a roughened top surface, and an associated method of forming such a MEMS package. In some embodiments, each roughened top surface includes a group of peaks and valleys, wherein the group of peaks and valleys is coupled to one another and includes an irregular distribution of heights. In some embodiments, the dummy pad is formed as a ring-like structure surrounding an edge of the respective wafer. In some embodiments, the dummy pad may be formed as a continuous or a discontinuous ring-like structure, which will be discussed in detail below with respect to FIG. 4. By utilizing such a ring-like structure with the roughened top surface surrounding the respective wafer, lateral friction between the first and second wafers may be substantially increased. As such, while coupling the bonding pads of the first and second wafers to form the disclosed MEMS package under an elevated temperature, the increased lateral friction between the dummy pads may advantageously eliminate the issues about the lateral shift, or substantially relieve the issues. In some embodiments, the roughened top surface may be selectively formed on the dummy pad before the bonding pads are sealed. Accordingly, the active devices of the MEMS device and the CMOS circuit may be kept intact. Aside from advantageously limiting lateral shift(s), the disclosed method is simple to incorporate into existing semiconductor manufacturing process, and is compatible with other MEMS materials (e.g., bulk silicon).

Figure 1B:
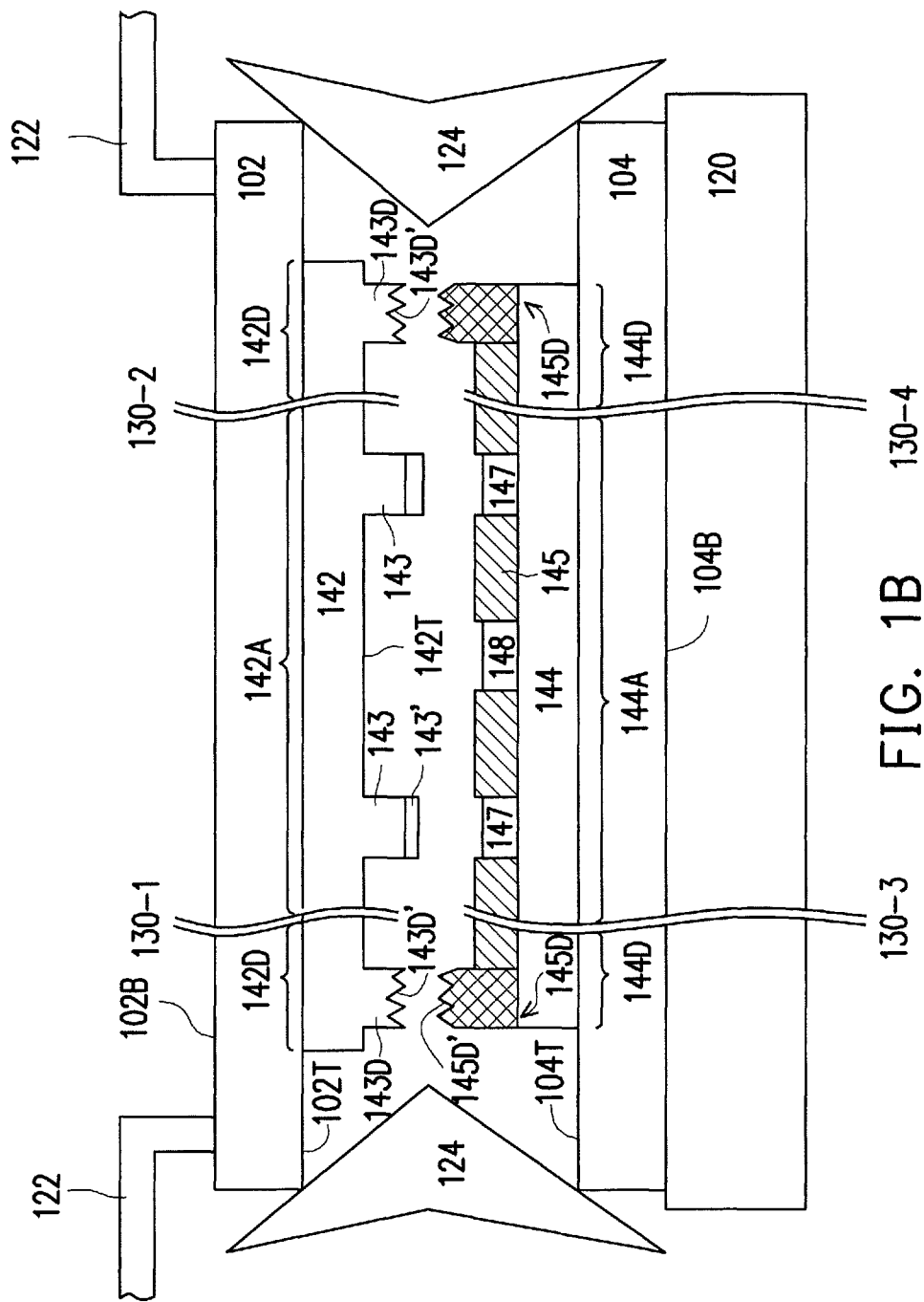
FIG. 1B illustrates a cross-sectional view of the to-be formed MEMS package of FIG. 1A, in accordance with some embodiments.

FIGS. 1A and 1B illustrate a top view and a cross-sectional view, respectively, of a first wafer 102 and a second wafer 104 at a particular stage of a bonding process to form a MEMS package, in accordance with various embodiments. As shown, at least a MEMS device 142 is formed on the first wafer 102, and at least a CMOS circuit 144 is formed on the second wafer 104. As mentioned above, after the first and second wafers (102 and 104) are coupled, at least one MEMS package is formed.

Referring first to the illustrated embodiment of FIG. 1A, during such a particular stage, the second wafer 104 is placed firmly on a bonding chuck 120 so that the first wafer 102 may be adjusted (moved) to align with the second wafer 104. In some embodiments, the second wafer 104 may be fixed to the bonding chuck 120 by using a vacuum device (not shown) coupled to the bonding chuck 120 that provides a suction force on a backside (104B in FIG. 1B) of the second wafer 104. Further, in some embodiments, before performing the alignment of the first wafer 102 to the second wafer 104, one or more metal plates 124 may be disposed around an edge of a top surface (104T in FIG. 1B) of the second wafer 104. In a non-limiting example, such metal plates 124 are used to prevent a lateral shift between the first and second wafers (102 and 104) that may be caused by mechanical and/or environmental factors, e.g., vibration, pressure change, etc. Accordingly, the first wafer 102 is adjusted to align with and placed above the second wafer 104 with the metal plates 124 disposed therebetween, as shown in the cross-sectional view of FIG. 1B. In some embodiments, after the first wafer 102 is aligned with and placed above the second wafer 104 (through the metal plates 124), one or more clamps 122, coupled to the bonding chuck 120, are placed on a backside (102B in FIG. 1B) of the wafer 102 to further securely couple the first wafer 102, the second wafer 104, and the metal plates 124 with one another. In some embodiments, the clamp 102 is configured to provide a vertically downward force to clamp (press) the first and second wafers (102 and 104) together through the metal plates 124.

According to some embodiments of the present disclosure, although the first wafer 102 includes a MEMS device (e.g., 142), and the second wafer 104 includes a CMOS circuit (e.g., 144), the first and second wafers (102 and 104) may each include any of a variety of devices/circuits in other embodiments while remaining within the scope of the present disclosure. In the following discussion of the embodiments of the present disclosure, at least one MEMS device (e.g., 142) is formed on a top surface of the wafer 102 (i.e., 102T in FIG. 1B), and at least one CMOS circuit (e.g., 144) is formed on a top surface of the wafer 104 (i.e., 104T in FIG. 1B). And the top surface 102T faces down and toward the top surface 104T, as shown in FIG. 1B.

More specifically, in some embodiments, the wafer 102 includes an active MEMS device region 142A and a dummy pattern region 142D, and the wafer 104 includes an active CMOS device region 144A and a dummy pattern region 144D. It is noted that the MEMS device 142 may include one or more active MEMS components (e.g., a mass spring, a mechanical vibrator, a mechanical relay, etc.) disposed in the active MEMS device region 142A. Similarly, the CMOS circuit 144 may include one or more active CMOS components (e.g., a channel, a fin channel, a recessed drain/source region, a gate, a gate oxide, etc.) in the active CMOS device region 144A, and each of the active CMOS components may include or be coupled with one or more electrical contacts 148. Thus, in some embodiments, the dummy pattern region 142D and the active MEMS device region 142A of the wafer 102 may be separated from each other. More specifically, in some embodiments, the dummy pattern region 142D is disposed around a respective edge of the wafer 102, and the dummy pattern region 144D is disposed around a respective edge of the wafer 104. Alternatively stated, the dummy pattern regions 142D and 144D are respectively formed in dies around the edges of the wafers 102 and 104, which are typically referred to as "ugly dies," and the active MEMS/CMOS devices regions 142A and 144A are respectively formed in dies relatively farther from the edges of the wafers 102 and 104. In some embodiments, such ugly dies may not include any active MEMS/CMOS components, and may be singulated and disposed after a bonding process of the wafers 102 and 104.

For purposes of illustration, accordingly, the dummy pattern region 142D and the active MEMS device region 142A are separated from each other by breakaway lines 103-1 and 103-2 as shown. Similarly, the dummy pattern region 144D and the active CMOS device region 144A are separated from each other, which are accordingly shown by breakaway lines 103-3 and 103-4. In some embodiments, the dummy pattern region 142D and the active MEMS device region 142A of the wafer 102 may be adjacent to each other; and the dummy pattern region 144D and the active CMOS device region 144A of the wafer 104 may be adjacent to each other.

As described above, in some embodiments, each of the first and second wafers (102 and 104) includes a bonding pad that is configured to bond each of the MEMS device 142 and the CMOS circuit 144 together. As shown in FIG. 1B, the MEMS device 142 formed on the first wafer 102 includes one or more bonding pads 143 disposed on a top surface 142T of the MEMS device 142, which faces a top surface of the CMOS circuit 144. In some embodiments, such bonding pads 143 may be configured to protrude beyond the top surface 142T of the MEMS device 142. In some embodiments, a eutectic layer 143', for facilitating eutectic bonding, may be formed on a top surface of each of the bonding pads 143, which will be discussed in further detail below.

In addition to the bonding pads 143 that may be formed in the active MEMS device region 142A or the dummy pattern region 142D, the wafer 102 includes one or more dummy MEMS pads 143D that are formed in the dummy pattern region 142D. In some embodiments, each of the dummy MEMS pads 143D is also configured to protrude beyond the top surface 142T of the MEMS device 142, and share a substantially similar height to the bonding pad 143.

As shown in FIG. 1B, each of the dummy MEMS pads 143D has a roughened top surface 143D'. Such a roughened top surface 143D', when in contact with a corresponding roughened top surface of the wafer 104 (e.g., during the bonding process), provides substantially increased lateral friction, which will be discussed further below. Further, in some embodiments, as shown in both FIGS. 1A and 1B, such dummy MEMS pads 143D are located on dies around the edge of the first wafer 102 (e.g., the above-mentioned edge dies), and beneath a location where the clamps 122 press. As such, the dummy MEMS pads 143D and its roughened top surface 143D' can directly receive a vertical downward force from the clamps 122 so as to assure the roughened top surface 143D' is in contact with a corresponding roughened top surface of the wafer 104 (which will be discussed below) when the clamps 122 press the first and second wafers (102 and 104) together, e.g., in a bonding process.

In some embodiments, the CMOS circuit 144 formed on the second wafer 104 includes one or more bonding pads 147 disposed in the active CMOS device region 144A. In some embodiments, the bonding pad 147 is substantially similar to the electrical contact 148 except that the bonding pad 147 may not be electrically connected to an active CMOS component. As shown in the illustrated embodiment of FIG. 1B, both of the electrical contact 148 and the bonding pad 147 are each formed as a recessed region within a passivation layer 145 (e.g., a silicon nitride ($Si_3N_4$) layer), which will be described in further detail below. Further, a portion of the passivation layer 145, e.g., 145D (hereinafter "dummy CMOS pad 145D"), has a roughened top surface 145D'. In some embodiments, such dummy CMOS pads 145D are located in dies around the edge of the wafer 104 forming a ring-shape, as shown in FIG. 1A, and the roughened top surface 145D' is configured to be in contact with the roughened top surface 143D' to form an interface when the first and second wafers (102 and 104) are in contact with each other, e.g., in a bonding process. In some embodiments, the roughened top surfaces 143D' and 145D', in contact, may advantageously limit a lateral shift between the first and second wafers (102 and 104), especially during the bonding process that is generally performed under an elevated temperature. As will be discussed in further detail below with respect to FIG. 1D, such an interface may include at least part of the groups of peaks and valleys of the roughened top surfaces (143D' and 145D').

Although the dummy pad 143D of the wafer 102 and the dummy CMOS pad 145D of the wafer 104 are each shown as a continuous ring in the illustrated embodiments of FIGS. 1A and 1B, the dummy MEMS pad 143D and the dummy CMOS pad 145D may be each formed as any of a variety of shapes/patterns, and/or in any of a variety of locations on the wafers 102 and 104, respectively. Some alternative embodiments of the dummy MEMS pattern 143D and dummy CMOS pattern 145D will be discussed in further detail below with respect to FIG. 4.

Figure 1C:
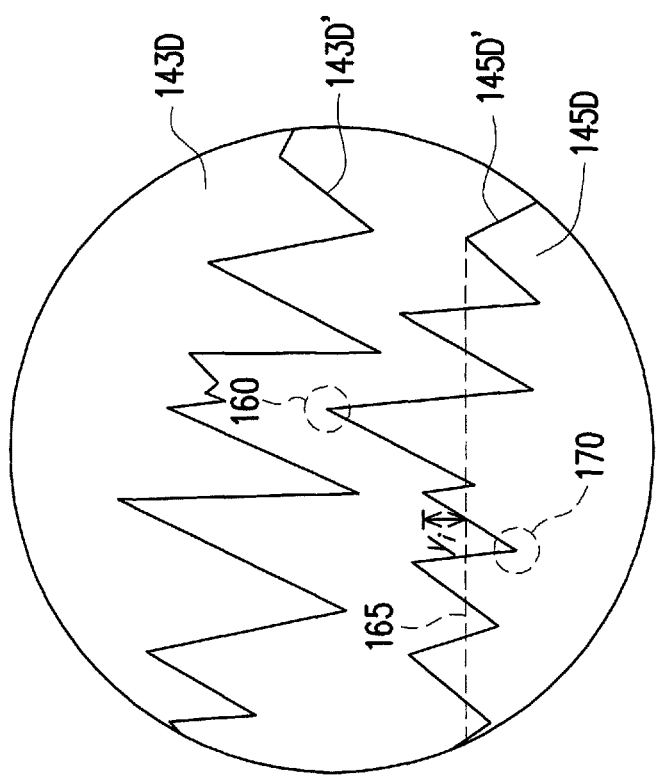
FIG. 1C illustrates an enlarged view of portions of two roughened top surface of the MEMS package of FIG. 1A, in accordance with some embodiments.
Figure 1D:
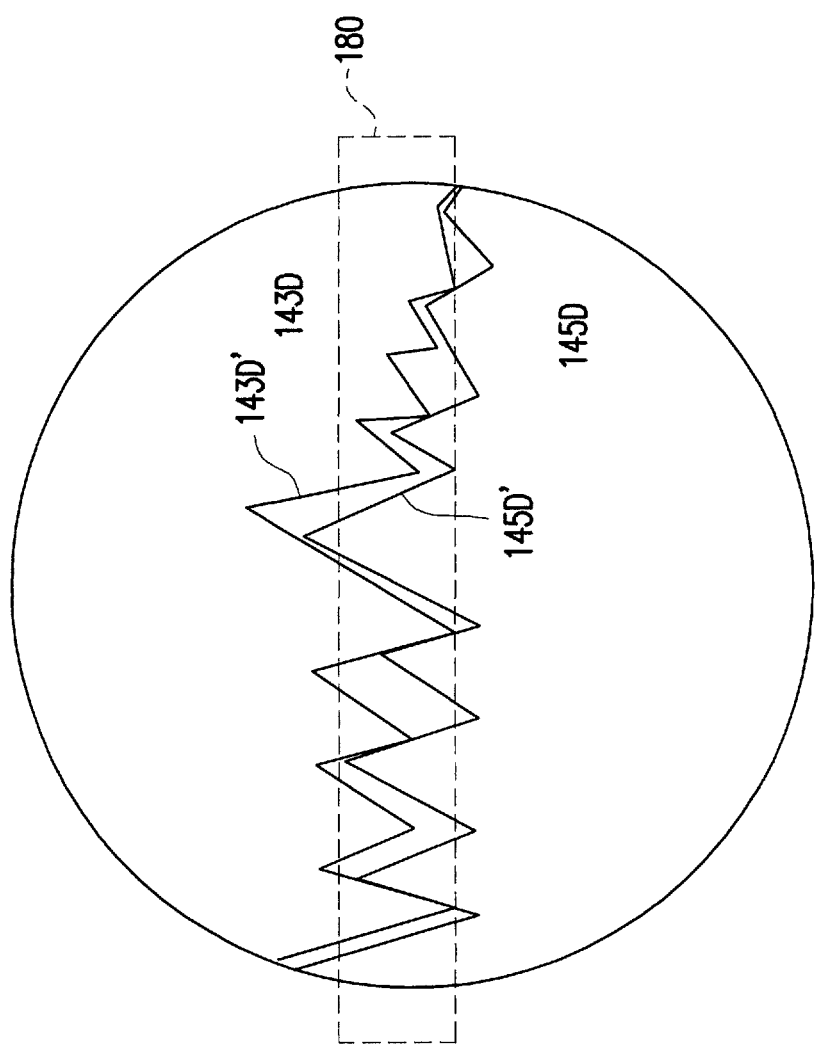
FIG. 1D illustrates an enlarged view of a portion of an interface that is formed when the two roughened top surfaces of FIG. 1C are in contact, in accordance with some embodiments.

FIG. 1C illustrates a cross-sectional view of an enlarged portion of the roughened top surfaces 143D' and 145D' of FIG. 1B, in accordance with various embodiments. In some embodiments, the roughened top surface 143D' and 145D' have a substantially similar morphology. Thus, for brevity, only the roughened top surface 145D' of the wafer 104 is labeled with reference numbers for purposes of discussion. As shown, the roughened top surface 145D' includes a group of peaks (e.g., 160) and valleys (e.g., 170), wherein each of the peaks and valleys are coupled to one another. In some embodiments, when the first and second wafers (102 and 104) are substantially adjacent to each other thereby causing the two roughened top surfaces (143D' and 145D') to be in contact, the respective series of peaks and valleys can increase lateral friction between the two roughened top surfaces (143D' and 145D'). FIG. 1D illustrates an exemplary embodiment when the two roughened top surfaces (143D' and 145D') are in contact with each other. More specifically, when in contact, an interface 180 is formed. The interface 180 includes at least part of the group of peaks and valleys of the surfaces 143D' that are in contact with at least part of the group of peaks and valleys of the surface 145D'. The in-contact peaks and valleys, or valleys and peaks, of the surfaces 143D' and 145D', respectively, advantageously increase the lateral friction between the first and second wafers (102 and 104). Thus, even during a bonding process performed under an elevated temperature, the lateral shift issue may be avoided, which in turn enhances the yield of forming a MEMS package, for example, a MEMS package constituted of the MEMS device 142 and the CMOS circuit 144.

Referring again to FIG. 1C, in some embodiments, the roughened top surface 145D' has a root mean square (RMS) surface roughness in a range of about 10 nanometers (nm) to about 80 nm, preferably greater than about 40 nm. The RMS surface roughness is calculated as the root mean square of a surface's measured microscopic peaks and valleys, as provided by the formula below:

$$R_q = \sqrt{\frac{1}{n}\sum_{i=1}^{n} y_i^2} \, ;$$

wherein $R_q$ is the RMS surface roughness of the roughened top surface 145D', $y_i$ is the vertical distance from a mean surface 165 to each of n data points, which can be spaced at regular intervals on the mean surface 165.

Figure 2:
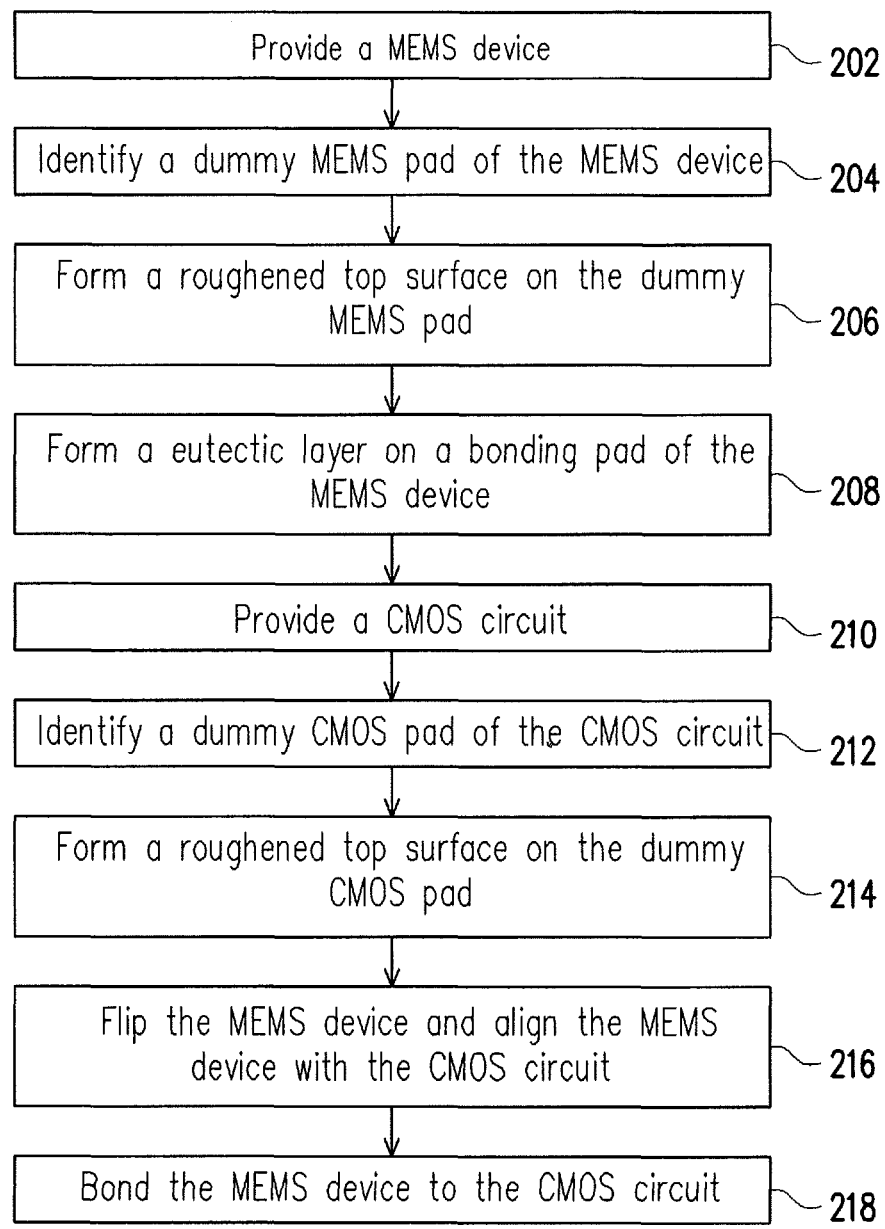
FIG. 2 illustrates a flow chart of a method to form the MEMS package of FIG. 1A, in accordance with some embodiments.

FIG. 2 illustrates an exemplary flow chart of a method 200 to form a MEMS package 300, in accordance with various embodiments. The method 200 is merely an example, and is not intended to limit the present disclosure. Additional operations can be provided before, during, and after the method 200, and some operations described can be replaced, eliminated, or moved around in accordance with additional embodiments. The method 200 is described below in conjunction with FIGS. 3A-3I that illustrate, in a cross-sectional view, a portion of the MEMS package 300 at various fabrication stages. Since the MEMS package 300 includes part of the components shown in FIGS. 1A-1D, some of the reference numbers are also used in the following discussions of FIGS. 2, and 3A-3I. As mentioned above, in some embodiments, the dummy pattern region 142D and the active MEMS device region 142A of the wafer 102 may be separated from each other; and the dummy pattern region 144D and the active CMOS device region 144A of the wafer 104 may be separated from each other. Accordingly, The following discussions with respect to FIGS. 3A-3I will have at least some of the above-mentioned breakaway lines 103-1 to 103-4 as proper.

The method 200 starts at operation 202 in which a first wafer (e.g., 102) including a MEMS device (e.g., 142) formed thereon is provided (FIG. 3A), in accordance with various embodiments. In some embodiments, the first wafer 102 may comprise bulk semiconductor substrates including one or more of, for example, silicon, germanium, silicon carbide, a group III element, and a group V element. In other embodiments, the first wafer 102 includes a semiconductoron-insulator (SOI) substrate, such as a silicon-on-insulator substrate or a polysilicon-on-insulator (POI) substrate, for example.

As described above with respect to FIG. 1B, the MEMS device 142 comprises one or more active MEMS components (e.g., a mass spring, a mechanical vibrator, a mechanical relay, etc.) and one or more bonding pads 143 disposed in the active MEMS device region 142A. And the dummy MEMS pads 143D surrounding the active MEMS components are disposed in the dummy pattern region 142D. Although not shown in the illustrated embodiments of FIG. 3A (and the following figures), it is noted that there may be also bonding pads 143 formed in the dummy pattern region 142D while remaining within the scope of the present disclosure. More specifically, in some embodiments, the bonding pad 143 and the dummy MEMS pad 143D are each configured to protrude the top surface 142T of the MEMS device 142. In some embodiments, the bonding pad 143 has a height 143$h$ of about 10 microns (μm) to about 50 μm, and a width 143$w$ of about 30 μm to about 120 μm, wherein the dummy MEMS pad 143D shares substantially similar height and width (143$h$ and 143$w$) dimensions to the bonding pad 143. In some embodiments, the MEMS device 142, including the active MEMS components, the bonding pad 143, and the dummy MEMS pad 143D, is formed of silicon while any of a variety of materials (e.g., metal materials, other semiconductor materials, etc.) may be used while remaining within the scope of the present disclosure.

Figure 3A:
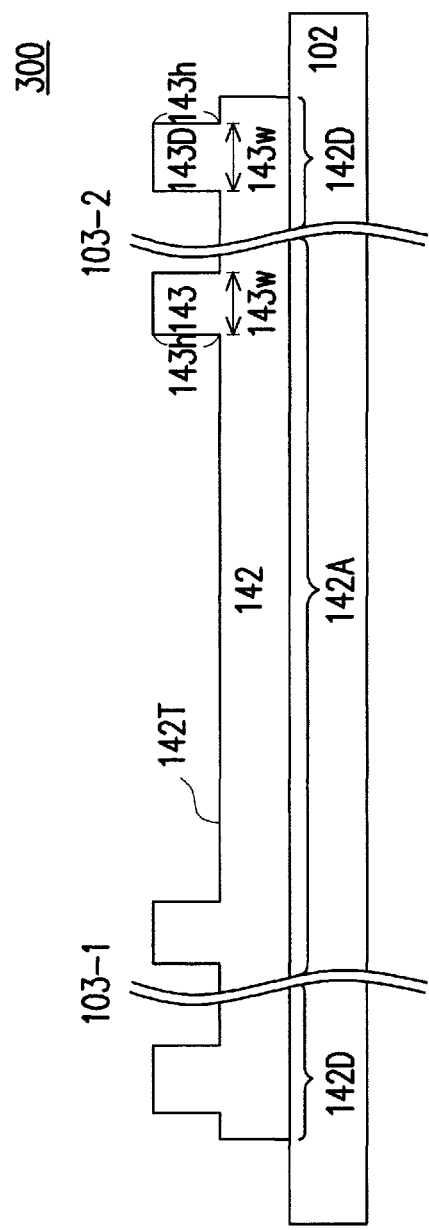
FIGS. 3A, 3B, 3C, 3D, 3E, 3F, 3G, 3H, and 3I are cross-sectional views of an exemplary MEMS package fabricated by the method of FIG. 2, in accordance with some embodiments.
Figure 3B:
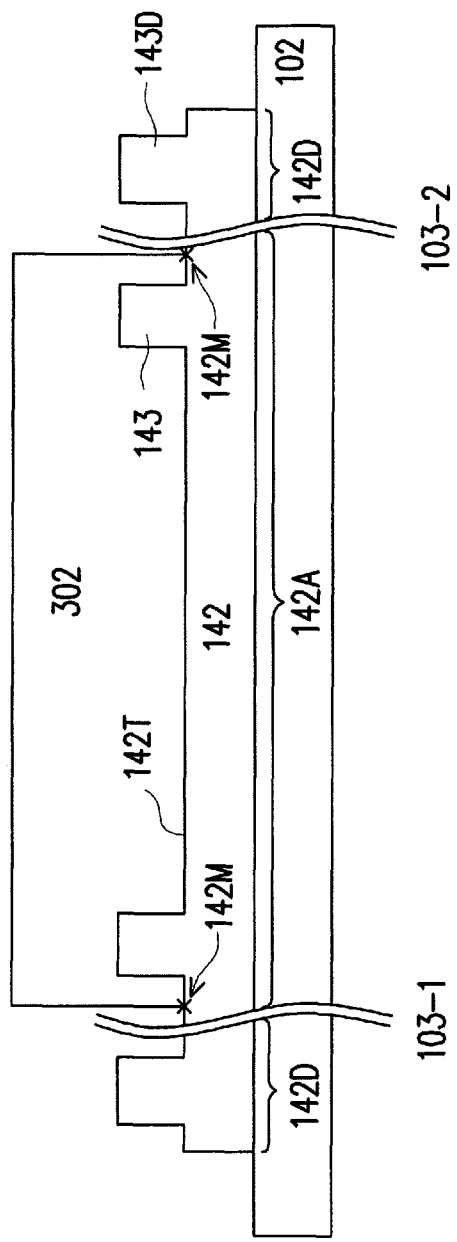
Figure 3C:
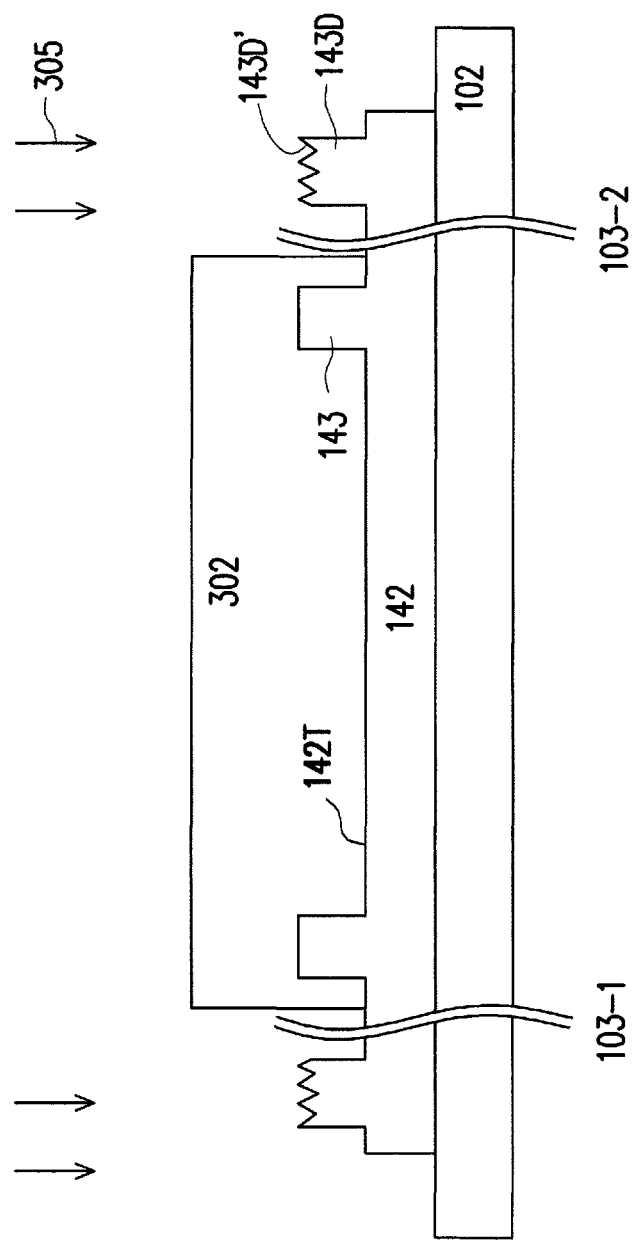

The method 200 continues to operation 204 in which the dummy MEMS pad 143D of the wafer 102 is identified (FIG. 3B), in accordance with various embodiments. As shown in FIG. 3B, the boundary 142M defines a location where the dummy MEMS pad 143D is formed. In some embodiments, during the operation 204, a photoresist layer 302 is disposed over a portion of the top surface 142T that is defined by the boundary 142M. Further, such a photoresist layer 302 is used to cover the active MEMS components in the active MEMS device region 142A and the bonding pad 143 in the active MEMS device region 142A. As such, the photoresist layer 302 may cause a remaining portion of the top surface 142T where no active MEMS components are disposed, i.e., the dummy pattern region 142D, to be exposed to a further process. In some embodiments, the photoresist layer 302 may be formed by one or more of the following process steps: a photoresist layer is formed over the top surface 142T; one or more patterning processes (e.g., a photolithography process), based on the boundary 142M, are performed on the photoresist layer; one or more patterning processes are performed to define the photoresist layer 302, as shown.

The method 200 continues to operation 206 in which the remaining portion of the top surface 142T is etched by a process 305 (FIG. 3C), in accordance with various embodiments. As such, the roughened top surface 143D' on the dummy MEMS pad 143D having a series of peaks and valleys (FIG. 1C) is formed. In some embodiments, after the etching process 305 is performed, the photoresist layer 302 is removed. In some embodiments, the process 305 may include a dry etching process and/or a wet etching process. The dry etching process may include using a plasma-assisted etching (e.g., a reactive-ion etching). More specifically, in some embodiments, such a plasma-assisted etching may use one or more of the following gaseous sources: chlorine ($Cl_2$), dichlorodifluoromethane ($CCl_2F_2$), tetrafluoromethane ($CF_4$), sulfur hexafluoride ($SF_6$), and nitrogen trifluoride ($NF_3$). The wet etching process may include using one or more of the following wet etchants: ($HNO_3+H_2O+HF$) and ($KOH+H_2O+IPA$), wherein $HNO_3$ refers to nitric acid, $H_2O$ refers to water, HF refers to hydrogen fluoride, KOH refers to potassium hydroxide, and IPA refers to isopropyl alcohol.

Figure 3D:
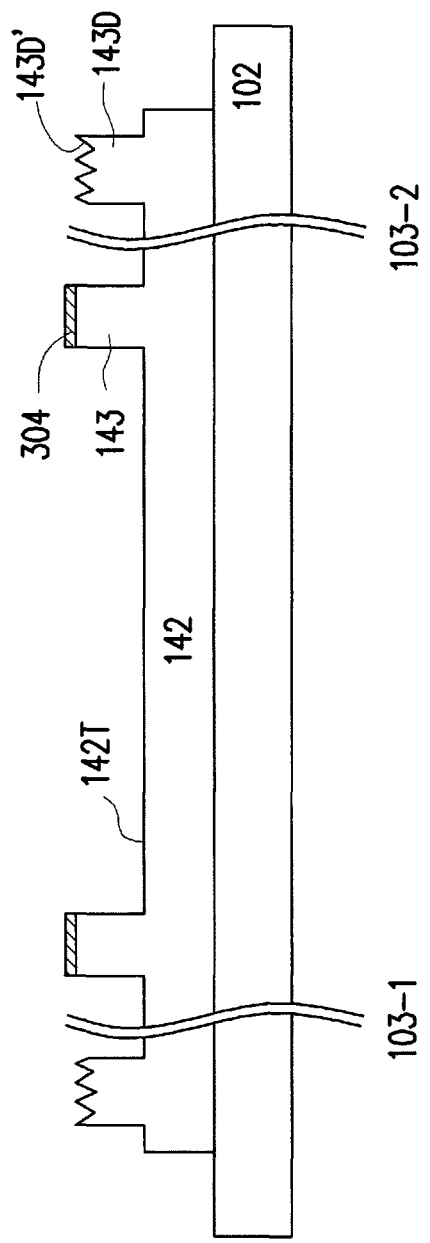

Next, the method 200 continues to operation 208 in which the eutectic layer 304 is formed on a top surface of the bonding pad 143, as shown in an exemplary embodiment of FIG. 3D. The eutectic layer 304 may comprise a semiconductor material such as, for example, germanium (Ge), silicon (Si), silicon germanium (SiGe), etc. In some embodiments, such a eutectic layer 304 is used in a eutectic bonding process that is configured to bond the first wafer 102 to another wafer (e.g., 104), which will be discussed in further detail below. Further to this embodiment, the eutectic layer 304 has a thickness of about 400 nm. In some embodiments, the eutectic layer 304 may be formed by at least one of the following process steps: a dummy eutectic layer is formed over the top surface 142T by any of a variety of deposition methods (e.g., CVD, ALD, LPCVD, MOCVD, etc.) to overlay the top surface of the bonding pad 143, and the roughened top surface 143D'; one or more patterning processes are performed to leave only the eutectic layer 304 formed on the top surface of the bonding pad 143.

The method 200 continues to operation 210 in which a second wafer (e.g., 104) including a CMOS circuit (e.g., 144) formed thereon is provided (FIG. 3E), in accordance with various embodiments. In some embodiments, the second wafer 104 may comprise bulk semiconductor substrates including one or more of, for example, silicon, germanium, silicon carbide, a group III element, and a group V element. In other embodiments, the second wafer 104 includes a semiconductor-on-insulator (SOI) substrate, such as a silicon-on-insulator substrate or a polysilicon-on-insulator (POI) substrate, for example.

As described above with respect to FIG. 1B, the CMOS circuit 144 includes one or more active CMOS components (e.g., a channel, a fin channel, a recessed drain/source region, a gate, a gate oxide, etc.) disposed in the active CMOS device region 144A. Further, the CMOS circuit 144 includes the passivation layer 145 formed thereon with one or more electrical contacts 148 and bonding pads 147 exposed in the active CMOS device region 144A and the dummy pattern region 144D, respectively. In some embodiments, the one or more electrical contacts 148 may be each coupled to one or more active CMOS components in the active CMOS device region 144A.

Figure 3E:
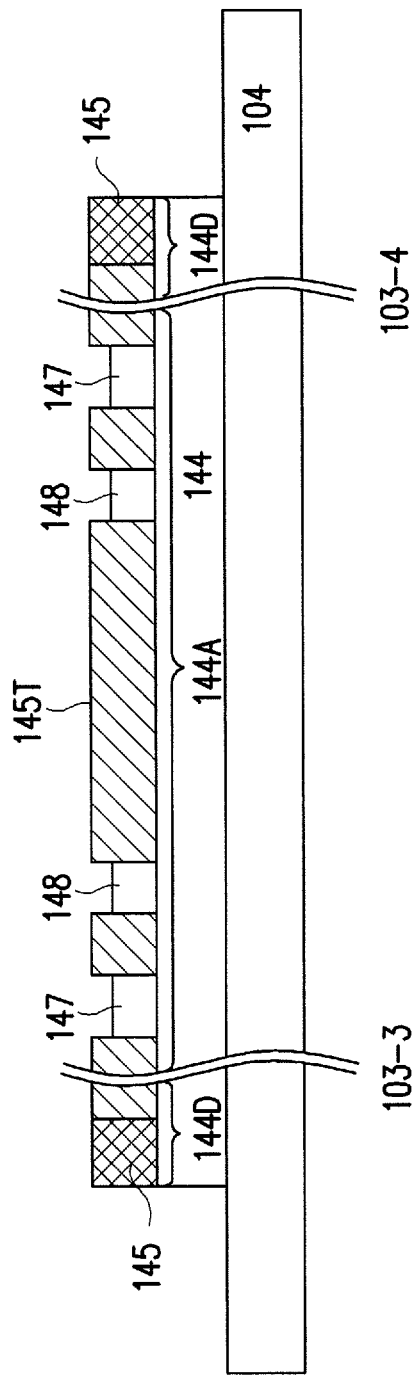

Although in the illustrated embodiments of FIG. 3E and other figures (e.g., FIG. 1B, etc.), the CMOS circuit 144 is shown as a single layer overlaid by the passivation layer 145 with exposed electrical contacts 148 and bonding pads 147, it is understood by people with ordinary skill in the art that the CMOS circuit 144 may include plural layers vertically overlaying with one another. For example, the CMOS circuit 144 may include a first plurality of layers where at least one transistor (i.e., a channel, a source region, a drain region, a gate oxide, a gate electrode) is formed. More particularly, such a transistor is formed in the active CMOS region 144A, in accordance with some embodiments. Above the first plurality of layers, the CMOS circuit 144 may include a second plurality of layers, wherein some may be formed as redistribution layers (RDL's) that are configured to redistribute electrical signals through multiple layers, and some may be formed as inter-layer dielectric (ILD) layers that are configured to provide isolation between two adjacent layers. For clarity, such additional layers are not shown in the figures of the current disclosure.

In some embodiments, prior to the operation 210, the electrical contact 148 and the bonding pad 147 was formed as part of a top metal layer of the CMOS circuit 144, and the passivation layer 145 is formed to overlay the top metal layer. That is, the electrical contact 148 and the bonding pad 147 are covered by the passivation layer 145. As such, during the operation 210, the CMOS circuit 144 may be provided by one or more of the following process steps: a photoresist layer is formed over the passivation layer 145 to locate the electrical contacts 148 and the bonding pads 147; one or more patterning processes (e.g., a photolithography process) are performed to pattern the photoresist layer; one or more etching processes are performed to form a plurality of openings in the photoresist layer to expose some portions of the passivation layer 145 that each corresponds to a respective location of the electrical contact or bonding pad; at least an etching process is performed to etch the exposed portions of the passivation layer 145 so as to expose the underneath electrical contact or bonding pad; the patterned photoresist layer is removed from the passivation layer 145.

Further to this embodiment of the operation 210, the electrical contact 148 and the bonding pad 147 may be formed of at least one of the materials: aluminum (Al), copper (Cu), titanium (Ti), tantalum (Ta), gold (Au), nickel (Ni), tin (Sn), or another metal. And the passivation layer 145 may be formed of at least one of the following materials: silicon nitride ($Si_3N_4$), silicon oxide ($SiO_2$), or another silicon-based material.

Figure 3F:
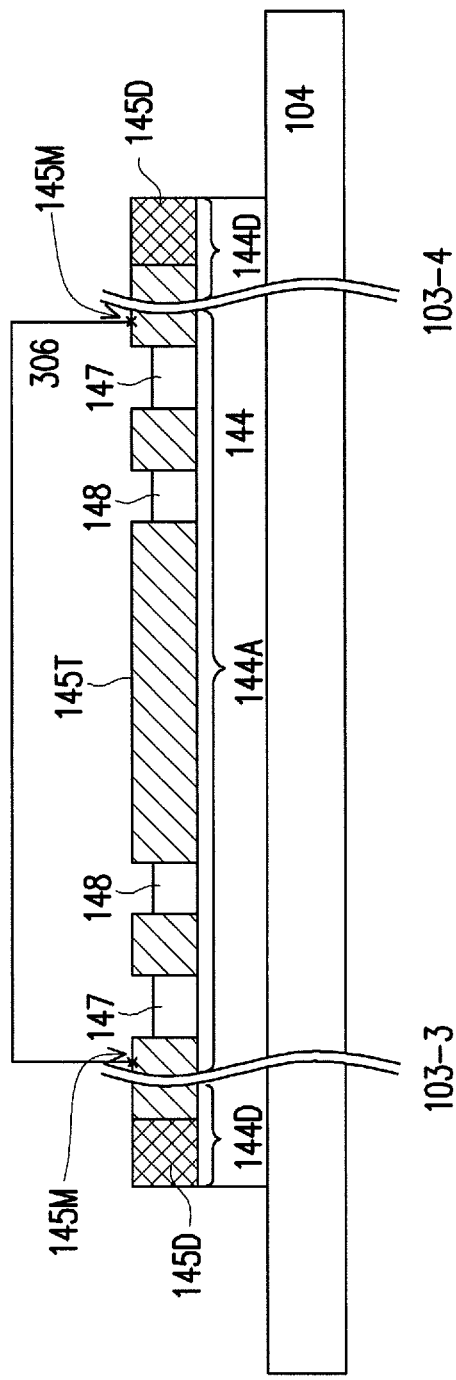
Figure 3G:
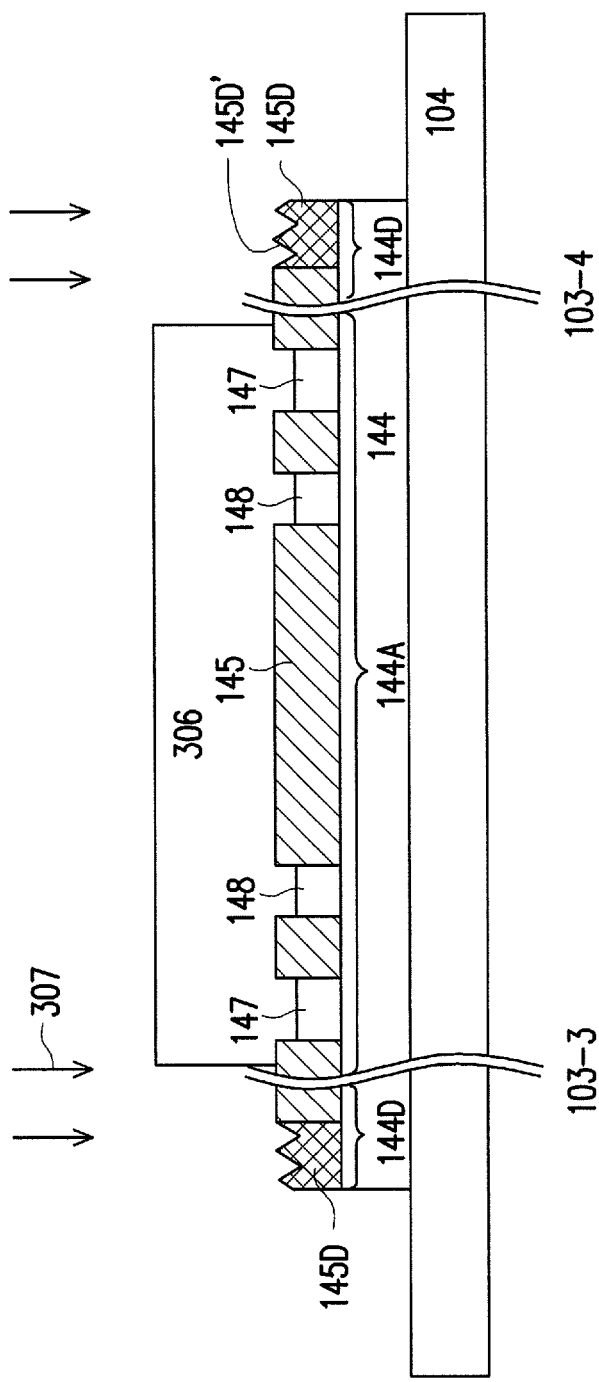
Figure 3H:
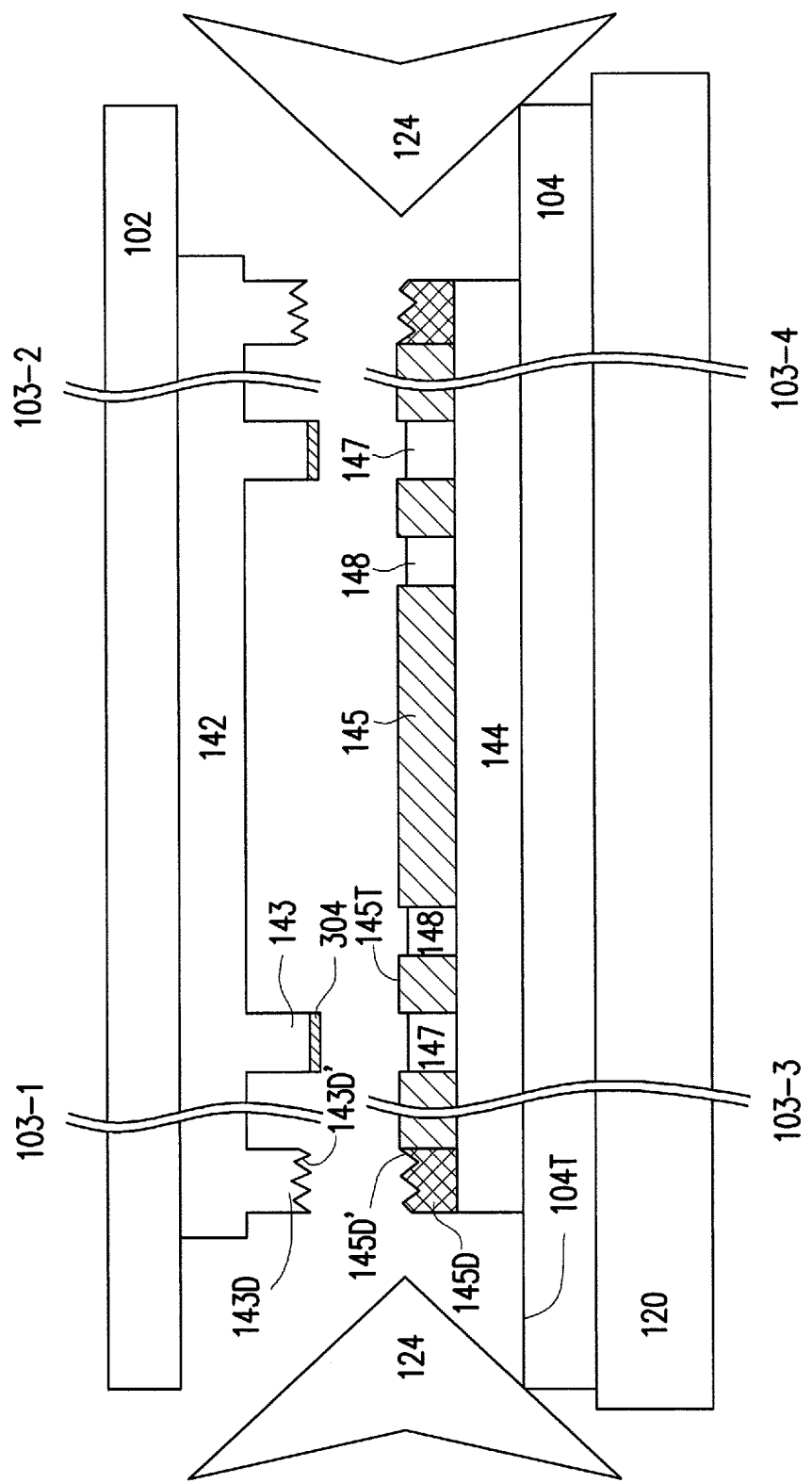
Figure 3I:
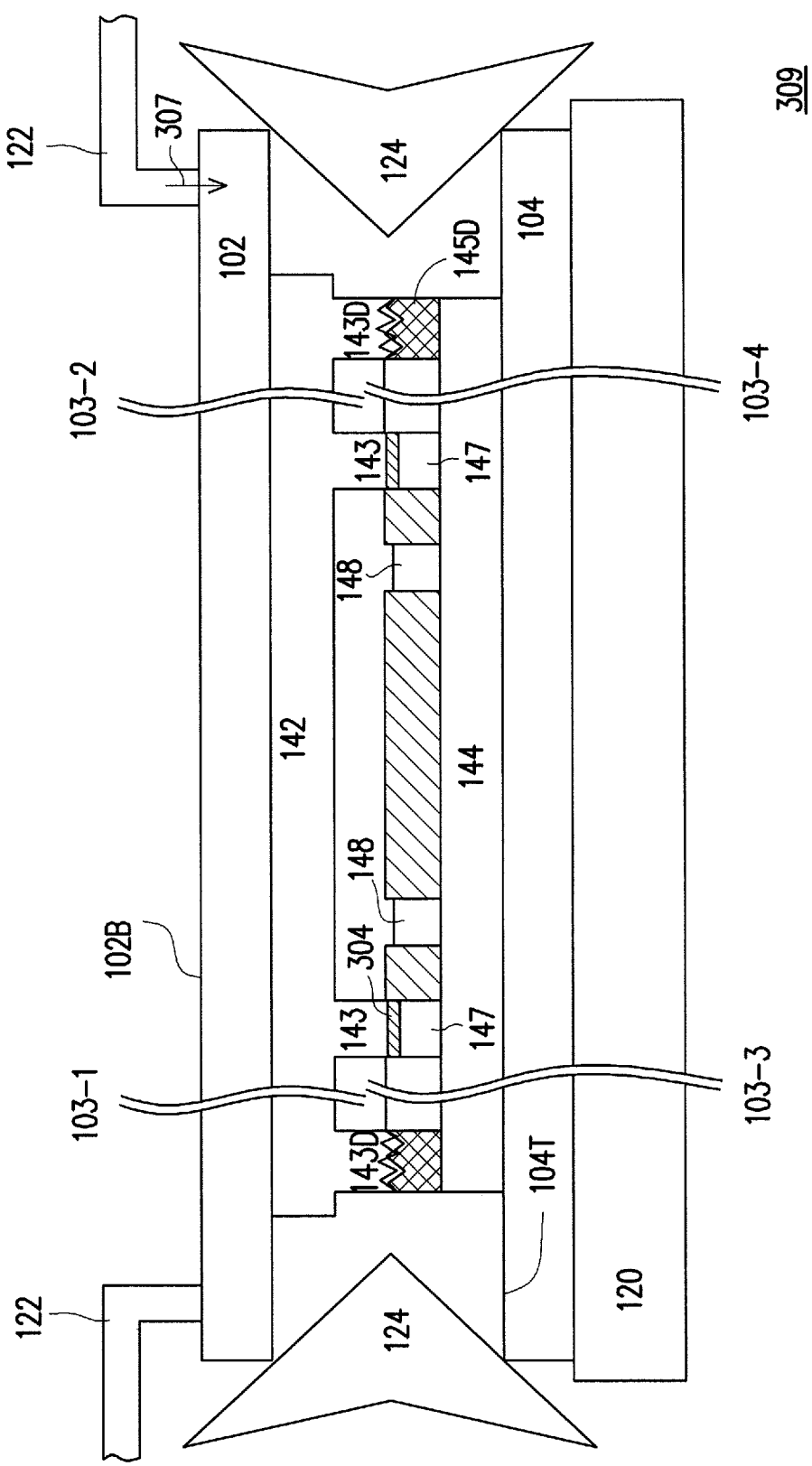

The method 200 continues to operation 212 in which the dummy CMOS pad 145D is identified (FIG. 3F), in accordance with various embodiments. In general, the operation 212 is substantially similar to the operation 204 in which the dummy MEMS pad 143D is identified. Referring now to FIG. 3F, the boundary 145M defines a real estate of the active CMOS circuit region 144A, i.e., where the dummy CMOS pad 145D is and/or can be formed. Further to the embodiment of the operation 212, a photoresist layer 306 is disposed over a portion of the top surface 145T that is defined by the boundaries 145M. Such a photoresist layer 306 is used to overlay and protect the electrical contacts 148 of the active CMOS components and the bonding pad 147 formed in the active CMOS device region 144A. As such, the photoresist layer 306 may cause a remaining portion of the top surface 145T, i.e., the dummy CMOS pad 145D, to be exposed to a further process. In some embodiments, the photoresist layer 306 may be formed by one or more of the following process steps: a photoresist layer is formed over the top surface 145T; one or more patterning processes (e.g., a photolithography process), in accordance with the boundary 145M, are performed on the photoresist layer; one or more photolithographic development processes are performed to pattern the photoresist layer 306, as shown.

The method 200 continues to operation 214 in which the remaining portion of the top surface 145T is etched by a process 307 to form the roughened top surface 145D' (FIG. 3G), in accordance with various embodiments. As such, the roughened top surface 147' having a series of peaks and valleys (also shown in FIG. 1C) is formed. Subsequently, the photoresist layer 306 is removed. In some embodiments, the process 307 may include a dry etching process and/or a wet etching process. The dry etching process may include using a plasma-assisted etching (e.g., a reactive-ion etching). More specifically, in the embodiment in which the passivation layer 145 includes $SiO_2$, such a plasma-assisted etching may use one or more of the following gaseous sources: $CF_4$, $SF_6$, and $NF_3$. And the wet etching process may include using one or more of the following wet etchants: HF (49%) and buffered oxide etch (BOE). In the embodiment in which the passivation layer 145 includes $Si_3N_4$, such a plasma-assisted etching may use one or more of the following gaseous sources: $CF_4$, $SF_6$, and $NF_3$. And the wet etching process may include using one or more of the following wet etchants: HF (49%), and ($H_3PO_4+H_2O$), wherein $H_3PO_4$ refers to phosphoric acid.

The method 200 continues to operation 216 in which the first wafer 102 is flipped and then the MEMS device 142 is to be aligned with the CMOS circuit 144 (FIG. 3H), in accordance with various embodiments. Alternatively, the second wafer 104 may be flipped to align with the MEMS device 142. Prior to or simultaneously with the operation 216, in some embodiments, the second wafer 104 may be placed and fixed on the bonding chuck 120 using a vacuum device, as described above. Further, one or more metal plates 124 may be placed around the edge and on the top surface 104T of the second wafer 104. After the second wafer 104 is fixed to the bonding chuck 120, the first wafer 102 is flipped to cause the bonding pad 143 and the roughened top surface 143D' to face down and toward the top surface 145T. Subsequently, in some embodiments, one or more alignment processes may be performed to align the MEMS device 142 with the CMOS circuit 144. More specifically, in accordance with various embodiments of the present disclosure, the alignment process causes the bonding pad 143 of the MEMS device 142 to be aligned with the bonding pad 147 of the CMOS circuit 144, and/or the dummy MEMS pad 143D of the wafer 102 to be aligned with the dummy CMOS pad 145D of the wafer 104. As such, the roughened top surfaces 143D' and 145D' are in contact when the first and second wafers (102 and 104) are disposed substantially adjacent to each other. In some embodiments, the operation 216 may be performed inside or outside a chamber where a bonding process will be performed, which will be discussed in further detail below.

The method 200 continues to operation 218 in which the MEMS device 142 is bonded to the CMOS circuit 144 (FIG. 3I), in accordance with various embodiments. Following the operation 216 (i.e., after the MEMS device 142 is aligned the CMOS circuit 144), in some embodiments, the clamp 122 is configured to press the backside 102B of the first wafer 102 thereby providing a downward force 307 to press the first and second wafers (102 and 104) together, through the metal plate 124, so as to assure the first and second wafers (102 and 104) are not slipped away from each other. In some embodiments, the metal plate 124 may be removed. Subsequently, the first and second wafers (102 and 104) are placed in a chamber 309 so as to allow a bonding process to be performed. In some embodiments, a eutectic bonding technique is used to perform the bonding process. For example, in the embodiments in which the eutectic layer 304 includes Ge and the bonding pad 147 includes Al, a eutectic bonding between Ge and Al is formed at an annealing temperature in a range from about 400° C. to about 450° C. to form a sealed bonding between the bonding pads 143 and 147 (with the eutectic layer 304 disposed therebetween). After the MEMS device 142 is bonded to the CMOS circuit 144 through the formation of the sealed bonding, the MEMS package 300 is formed, and, then, in some embodiments, the clamp 122 is disengaged, the metal plate 124 is removed, and the formed MEMS package 300 that includes the bonded first and second wafers (102 and 104) is removed from the chamber 309. In some embodiments, the MEMS package 300, which can include a plurality of bonded MEMS devices 142 and CMOS circuits 144 that are formed on respective dies, may be cut to singulate each of such dies from one another. Further, each of such dies is spaced and different from the ugly die that includes the dummy MEMS pad 143D and dummy CMOS pad 145D, which causes each singulated die to include at least one respective a MEMS device (e.g., 142) and a CMOS circuit (e.g., 144) bonded through respective bonding pads (e.g., 143 and 147).

To recap, the embodiments of the present disclosure use the roughened top surfaces (143D' and 145D') respectively formed on the dummy MEMS pad 143D and the dummy CMOS pad 145D to increase lateral friction between the first and second wafers (102 and 104) while they are being bonded. Thus, even though the MEMS package 300 is formed (i.e., the wafers are bonded) under an elevated temperature, the wafers 102 and 104 do not suffer the lateral shift issue, as described above.

Figure 4:
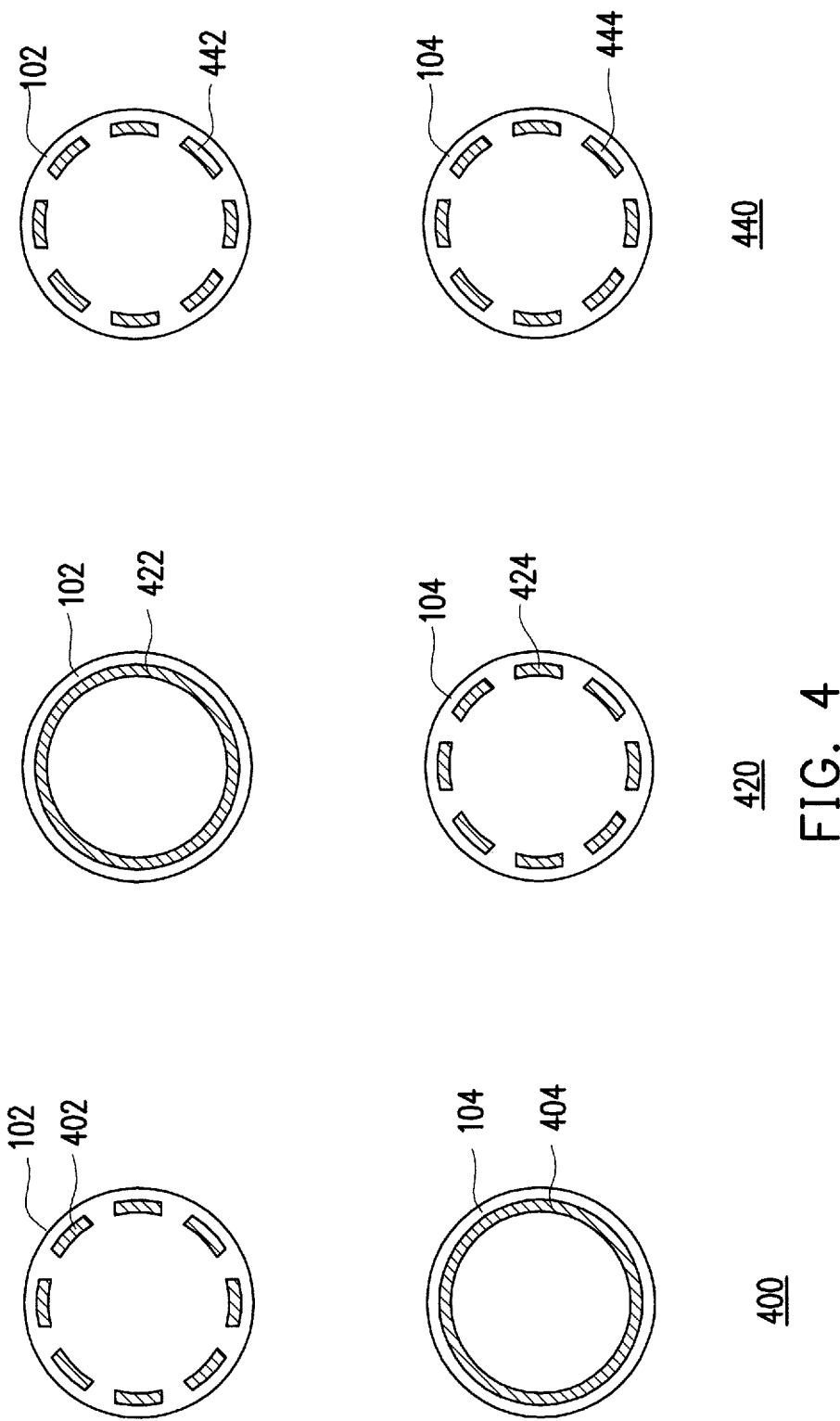
FIG. 4 illustrate plural alternative configurations of dummy MEMS pads and dummy CMOS pads of the MEMS package of FIG. 1, in accordance with some embodiments.

FIG. 4 illustrate plural alternative configurations of the dummy MEMS pads 143D and dummy CMOS pads 145D, respectively, in accordance with various embodiments. In the above discussions of the dummy MEMS pad 143D and the dummy CMOS pad 145D, each of them is formed as a continuous ring-like structure (FIG. 1A). In some other embodiments of the present disclosure, the dummy MEMS pad 143D/dummy CMOS pad 145D may be formed as a group of discrete segments that are each located substantially adjacent to the edge of the respective wafer. For example, in the illustrated embodiment of 400, the dummy MEMS pad 143D may include a group of segments 402 that surround the edge of the wafer 102, and the dummy CMOS pad 145D is still formed as a continuous ring-like structure 404. More specifically, in accordance with some embodiments of the present disclosure, a top surface of each of the segments 402 and a top surface of the continuous ring-like structure 404 are roughened by above-described etching methods, respectively, so as to provide increased lateral friction when the first and second wafers (102 and 104) are adjacent to each other during a bonding process. Similarly, as shown in another illustrated embodiment 420, the dummy MEMS pad 143D may be formed as a continuous ring-like structure 422, and the dummy CMOS pad 145D may include a plurality of discrete segments 424. As shown in yet another embodiment 440, the dummy MEMS pad and the dummy CMOS pad 145D each includes a respective group of discrete segments 442 and 444, wherein a top surface of each of the segments 442 is roughened, and such a roughened top surface of the segment 422 is in contact with a roughened top surface of a corresponding segment 444.

In an embodiment, a method includes: providing a first substrate on which a first semiconductor device is formed; providing a second substrate on which a second semiconductor device is formed; and coupling the first and second substrates by contacting respective dummy pads of the first and second substrates, wherein at least one of the dummy pads of the first and second substrates comprises plural peaks and valleys.

In another embodiment, a method includes: providing a first substrate on which a first semiconductor device is formed, wherein the first semiconductor device is surrounded by a first dummy pad; providing a second substrate on which a second semiconductor device is formed, wherein the second semiconductor device is surrounded by a second dummy pad; and coupling the first and second substrates by contacting the first and second dummy pads, wherein at least one of the first and second dummy pads comprises plural peaks and valleys.

Yet in another embodiment, a method includes: providing a first substrate on which a first semiconductor device is formed, wherein the first semiconductor device is at least partially surrounded by a plurality of first dummy pads; providing a second substrate on which a second semiconductor device is formed, wherein the second semiconductor device is at least partially surrounded by a plurality of second dummy pads; roughing respective top surfaces of the first dummy pads; roughing respective top surfaces of the second dummy pads; flipping the second substrate and aligning the first semiconductor device with the second semiconductor device; and coupling the first and second substrates by contacting the first and second dummy pads.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a first substrate on which a plurality of first semiconductor devices is formed;
providing a second substrate on which a plurality of second semiconductor devices is formed;
roughening a top surface of a first dummy pad extending outwardly from the first substrate, wherein the first dummy pad is formed as a ring-shape configuration that surrounds the plurality of first semiconductor devices;
roughening a top surface of a second dummy pad extending outwardly from the second substrate, wherein the second dummy pad is formed as a ring-shape configuration that surrounds the plurality of second semiconductor devices;
providing a first bonding pad extending outwardly from the first substrate, the first bonding pad being surrounded by the first dummy pad; and
providing a second bonding pad extending outwardly from the second substrate, the second bonding pad being surrounded by the second dummy pad, wherein the first and second bonding pads are located so as to be bonded with each other when the first and second substrates are coupled to one another;
coupling the first and second substrates by contacting the roughened top surfaces of the first and second dummy pads with each other so as to limit a lateral shift between the first and second substrates, wherein each of the top surfaces of the first and second dummy pads of the first and second substrates comprises plural peaks and valleys; and
providing a metal plate around an edge of a top surface of the second substrate so as to prevent lateral shifting between the first and second substrates after they are coupled to one another.

2. The method of claim 1, wherein the first semiconductor device comprises a micro-electro-mechanical system (MEMS) device.

3. The method of claim 1, wherein the second semiconductor device comprises a complementary metal-oxide-semiconductor (CMOS) circuit.

4. The method of claim 1, wherein before coupling the first and second substrates, the method further comprises:
flipping the second substrate and aligning the first semiconductor device with the second semiconductor device.

5. The method of claim 1, wherein the first dummy pad of the first substrate is disposed in a non-active region on the first substrate where the plurality of first semiconductor devices are absent.

6. The method of claim 1, wherein the second dummy pad of the second substrate is disposed in a non-active region on the second substrate where the plurality of second semiconductor devices are absent.

7. The method of claim 1, wherein the coupling the first and second substrates further comprises:
bonding the first and second bonding pads to each other under an elevated temperature.

8. The method of claim 7, further comprising:
forming a eutectic layer on a top surface of the first bonding pad of the first substrate before the bonding process.

9. A method, comprising:
providing a first substrate on which a plurality of first semiconductor devices are formed, wherein the plurality of first semiconductor devices are at least partially surrounded by a plurality of first dummy pads arranged in a ring configuration around the plurality of first semiconductor devices;
providing a second substrate on which a plurality of second semiconductor devices are formed, wherein the plurality of second semiconductor devices are at least partially surrounded by a plurality of second dummy pads arranged in a ring configuration around the plurality of second semiconductor devices;
roughening respective top surfaces of each of the plurality of first dummy pads;
roughening respective top surfaces of each of the plurality of second dummy pads;
providing a first bonding pad extending outwardly from the first substrate, the first bonding pad being at least partially surrounded by the plurality of first dummy pads;
providing a second bonding pad extending outwardly from the second substrate, the second bonding pad being at least partially surrounded by the plurality of second dummy pads, wherein the first and second bonding pads are located so as to be bonded with each other when the first and second substrates are coupled to one another;
coupling the first and second substrates by contacting respective top surface of the plurality of first and second dummy pads with each other so as to limit a lateral shift between the first and second substrates, wherein each of the top surfaces of the plurality of first and second dummy pads comprises plural peaks and valleys; and
providing a metal plate around an edge of a top surface of the second substrate so as to prevent lateral shifting between the first and second substrates after they are coupled to one another.

10. The method of claim 9, wherein before coupling the first and second substrates, the method further comprises:
flipping the second substrate and aligning the first semiconductor device with the second semiconductor device.

11. The method of claim 9, wherein the first semiconductor device comprises a micro-electro-mechanical system (MEMS) device.

12. The method of claim 9, wherein the second semiconductor device comprises a complementary metal-oxide-semiconductor (CMOS) circuit.

13. The method of claim 9, wherein the first dummy pads are disposed in a non-active region on the first substrate where the first semiconductor device is absent, and the second dummy pads are disposed in a non-active region on the second substrate where the second semiconductor device is absent.

14. The method of claim 9, wherein the coupling the first and second substrates further comprises:
bonding the first and second bonding pads to each other under an elevated temperature.

15. The method of claim 14, further comprising:
forming a eutectic layer on a top surface of the first bonding pad of the first substrate before the bonding process.

16. A method, comprising:
providing a first substrate on which a first semiconductor device is formed, wherein the first semiconductor device is at least partially surrounded by a plurality of first dummy pads;
providing a second substrate on which a second semiconductor device is formed, wherein the second semiconductor device is at least partially surrounded by a plurality of second dummy pads;
roughing respective top surfaces of the first dummy pads;
roughing respective top surfaces of the second dummy pads;
flipping the second substrate and aligning the first semiconductor device with the second semiconductor device;
providing a first bonding pad extending outwardly from the first substrate, the first bonding pad being at least partially surrounded by the plurality of first dummy pads;
providing a second bonding pad extending outwardly from the second substrate, the second bonding pad being at least partially surrounded by the plurality of second dummy pads, wherein the first and second bonding pads are located so as to be bonded with each other when the first and second substrates are coupled to one another;
coupling the first and second substrates by contacting the roughened top surfaces of respective first and second dummy pads with each other so as to limit a lateral shift between the first and second substrates; and
providing a metal plate around an edge of a top surface of the second substrate so as to prevent lateral shifting between the first and second substrates after they are coupled to one another.

17. The method of claim 16, wherein the first semiconductor device includes a micro-electro-mechanical system (MEMS) device.

18. The method of claim 16, wherein the second semiconductor device includes a complementary metal-oxide-semiconductor (CMOS) circuit.

19. The method of claim 16, wherein the coupling the first and second substrates further comprises:
bonding the first and second bonding pads to each other under an elevated temperature.

20. The method of claim 16, further comprising:
forming a eutectic layer on a top surface of the first bonding pad of the first substrate before the bonding process.

* * * * *